(12) United States Patent
John et al.

(10) Patent No.: US 6,524,517 B1
(45) Date of Patent: Feb. 25, 2003

(54) METHODS FOR MOLDING AND GRAFTING HIGHLY UNIFORM POLYMER LAYERS ONTO ELECTRONIC MICROCHIPS

(75) Inventors: Havens R. John, San Diego, CA (US); Dan Smolko, Jamul, CA (US); Jain Krotz, San Diego, CA (US); John J. Scott, Lafayette, IN (US)

(73) Assignee: Nanogen, Inc., San Diego, CA (US)

( * ) Notice: Subject to any disclaimer, the term of this patent is extended or adjusted under 35 U.S.C. 154(b) by 0 days.

(21) Appl. No.: 09/464,651

(22) Filed: Dec. 15, 1999

(51) Int. Cl.[7] .................... B29C 35/08; B29C 39/10; B29C 70/70; B29C 70/78
(52) U.S. Cl. ................. 264/496; 264/272.17; 427/519; 427/572
(58) Field of Search ................. 264/496, 494, 264/272.15, 272.17, 39, 279, 279.1; 427/572, 519, 512; 425/116, 120, 174.4, 174.6

(56) References Cited

U.S. PATENT DOCUMENTS

| 3,981,671 A | 9/1976 | Edwards ............. 425/453 |
|---|---|---|
| RE30,130 E | 10/1979 | Edwards ............. 425/453 |
| 4,205,028 A | 5/1980 | Brueggemann et al. |
| 4,284,399 A | 8/1981 | Newcomb et al. ............. 425/410 |
| 4,497,763 A | 2/1985 | Monnet |
| 4,897,228 A * | 1/1990 | Miwa et al. ............. 264/1.33 |
| 5,164,162 A | 11/1992 | Ridenour ............. 422/131 |
| 5,496,509 A | 3/1996 | Yamamoto et al. |
| 5,510,074 A | 4/1996 | Rose |
| 6,031,277 A * | 2/2000 | Sugiura et al. ............. 257/666 |
| 6,039,897 A * | 3/2000 | Lochhead et al. ......... 264/1.24 |
| 6,064,461 A * | 5/2000 | Nishida ............. 349/155 |
| 6,099,783 A * | 8/2000 | Scranton et al. ......... 264/272.11 |
| 6,136,444 A * | 10/2000 | Kon et al. ............. 349/122 |
| 6,143,412 A * | 11/2000 | Schueller et al. ........... 428/213 |
| 6,197,145 B1 * | 3/2001 | Todd et al. ............. 156/245 |
| 6,245,249 B1 * | 6/2001 | Yamada et al. ............. 134/1.1 |

* cited by examiner

Primary Examiner—Angela Ortiz
(74) Attorney, Agent, or Firm—O'Melveny & Myers LLP

(57) ABSTRACT

Microreaction molds and methods of molding very thin films onto substrate surfaces are provided. The molds and molding methods allow for consistency and uniformity in the thicknesses of the films that are applied to the substrate surfaces. The molds may be single composite, such as etched silica, or multicomposite, such as quartz/metal. The molds may further comprise an adjustable molding cavity. The molds of this invention are particularly applicable to generating thin polymeric films onto microchip substrates.

33 Claims, 12 Drawing Sheets

METHODS FOR MOLDING AND GRAFTING HIGHLY UNIFORM POLYMER LAYERS ONTO ELECTRONIC MICROCHIPS

FIELD OF THE INVENTION

This invention relates to microscale systems and methods for molding and grafting materials on a planar substrate. More specifically, this invention relates to the molding and grafting of highly uniform and very thin layers of polymeric materials onto the surface of electronically addressable microchips and other small substrate surfaces.

BACKGROUND OF THE INVENTION

The following description provides a summary of information relevant to the present invention. It is not an admission that any of the information provided herein is prior art to the presently claimed invention, nor that any of the publications specifically or implicitly referenced are prior art to the invention.

The application of thin films to substrate surfaces on a microscale level has predominantly been an issue in the electronics industry. Such application has also predominantly involved the use of spin coating and masking lamination technologies. However, with respect to applying thin films comprising permeable polymer layers to electronically addressable microchips used in the isolation and detection of biomaterials, neither masking lamination or spin coating provide particularly optimal results.

For example, the use of spin coating of permeation layers on substrates comprising electronically addressable microchip cartridge designs that are not perfectly planar often results in problems obtaining uniform layers in selected regions of the microchip. Consequently, spin coating onto nonplanar surfaces results in wide thickness variations of the applied permeation layer.

The working requirements of the microchips include very tight tolerances in applied and realized electronic potentials and currents at the surface of the layer above the electrodes of the microchip. Therefore, permeation layer thicknesses are required to be uniform. Variations in the thickness result in uncontrollable variables when attempting to transport biomaterials among the electronically addressable capture sites of the microchip.

In another aspect, when agarose is applied via spin coating, the process must be kept within a specific temperature range for proper spreading of the agarose. If the temperature is too low, the agarose will congeal prematurely and not spread properly. Where synthetic hydrogels based on monomeric solutions are to be applied by spin coating and subsequently crosslinked, it is necessary to add soluble polymers to the hydrogel solution in order to increase the viscosity so that films of appropriate thickness will be realized. However, addition of viscosity enhancing polymers changes the final composition of the permeation layer as well as the performance characteristics of the layer in allowing polyelectrolyte and ion electrophoresis between the electrode and the top surface of the layer. Spin coating is further problematic in that it requires high velocities for radial spreading of the monomers or monomer/polymer mixtures. Such high velocities can cause damage to the substrate.

Other methods have also been employed to provide a more uniform thickness. For example, in an attempt to cast thin films onto microchips, a coverslip method has been used wherein a coverslip is applied directly to a solution of a polymerizeable material prior to actual polymerization with the idea that the coverslip would provide for a uniform polymerized layer on top of the microchip. Although such a method improves surface uniformity, there is a large variability of thickness which contravenes the application of such a method where highly sensitive electronic addressing and high volume manufacturing is of concern.

In still other microscale molding applications, some processes use pressurized molds where the mold is pressurized between 1 and 50 atm to prevent the formation of voids or volume shrinkage upon polymerization. (Micro and Nano Patterning Polymers, Oxford University Press, 1993, ISBN 0841235813) Still other systems use solution injection or component mixing in the microreaction mold.

In contrast, we have developed a simple microreaction molding system that generates highly uniform films directly on the surface of a substrate, such as a microchip, which avoids thickness variation problems experienced in spin coating and coverslip oriented polymerization techniques. Moreover, we have developed a means for directly forming permeation layers having reproducible thickness onto electronically addressable microchips and other substrates. This invention may be applied to attachment of multiple thin films or layers of a hydrogel and grafts of polymeric materials on a substrate in a manner that is applicable to high volume and inexpensive manufacture. This molding system further provides for creating a substrate having multiple permeation layers having a multiplicity of characteristics.

SUMMARY OF THE INVENTION

In one embodiment of the invention, a molding system is provided comprising a two-part mold having a transparent window element and a metal or polymer mold casing or frame. Preferably, metal used for the casing can be 304 stainless steel, 316 stainless steel or titanium. For embodiments using a polymer casing, examples of a suitable polymer include polytetrafluoroethylene, polyfluoroalkoxane (PFA), and polyetheretherketone (PEEK).

In this two-part mold embodiment, the transparent window can be made of any material that will allow the transmission of at least one wavelength of electromagnetic radiation, in particular ultra violet (UV), visible (Vis), and infrared (IR). In preferred embodiments, acceptable window materials may comprise crystalline substances such as fused silica, quartz, sapphire, geranium, silicon, or glass, or organic polymeric materials such a plexiglass, polyacrylates, and polycarbonates. The window element further comprises an upper surface that serves as a "base plate" or mold bottom that is fitted into the mold frame. This surface generally can comprise any contour for making a patterned surface to the material being molded as a thin film. In a preferred embodiment, such surface is planar. By planar is meant a surface that has vertical height variations less than 1 $\mu$m. By patterned is meant a surface which has a vertical contour variations greater than 1 $\mu$m. Whether planar or patterned, the window element and its upper surface affording the radiation access to the mold cavity.

In order for the window element to form the mold bottom, the upper surface of the window element is offset from the top of the frame element thereby forming a mold cavity. In a preferred embodiment, the offset is between 100 nanometers and 100 $\mu$m below the frame surface. Additionally, this offset is variable by the fact that the window element is 'slidably' connected to and encased by the frame element. By slidably is meant that the position of the window element is adjustable by sliding the window inside the frame element.

In another embodiment, the system couples photopolymerization and molding into a single process. In this embodiment, the window is transparent to UV light energy which is used to initiate photopolymerization of a reactive monomer solution that upon polymerization becomes the thin film which in turn becomes attached to the surface of the microchip or other substrate during polymerization. In this system an UV light initiator such as 50% 2,4,6-trimethylbenzoyl diphenylphosphine oxide and 50% 2-hydroxy 2-methyl-1-phenyl-propan-1-one (D 4265) may be used with a polymerizable monomer to initiate polymerization.

In another embodiment, polymerization initiation may be carried out using a window that is transparent to thermal energy in the form of IR irradiation. In this embodiment, the monomer solution and mold are heated to a specific temperature range thereby causing activation of heat sensitive polymerization initiators such as azobisisobutyronitrile (AIBN).

In a further embodiment, polymerization may be carried out using chemical energy wherein monomer polymerization takes place over a short period of time in the mold cavity using chemical initiators such as ammonium persulfate/tetramethyl ethylenene diamine (APS/TEMED).

In still further embodiments, window elements that are transparent to visible light may be used where chemical initiators that are sensitive to visible light wavelengths are used in the polymerization reaction.

In another embodiment, the microchip or other substrate forms a top or 'cap' of the mold system. Having the substrate comprise one of the sides of the mold acts to simplify the mold system while at the same time providing a mechanism for defining the thickness of the film, as determined by the space between the substrate surface and mold cavity bottom.

In another embodiment, the two-part mold system comprises a means for filling the mold well using ports that allow the monomer solution to flow into the mold from one side to the opposite side of the mold where there is an exit port for excess fluid.

In still another embodiment, the mold system may also comprise instead of a two-part mold, a single-part mold or 'noncomposite' mold comprising a plate that is transparent to at least one wavelength of electromagnetic radiation. In this embodiment, a mold cavity is formed in an upper surface of the plate to a depth of between 100 nanometers and 100 $\mu$m. In a preferred embodiment, the plate may be made of materials such as fused silica, quartz, sapphire, geranium, silicon, glass, polyacrylates, polycarbonates, and plexiglass. In this embodiment, the substrate also serves as a top to the mold. In a further embodiment, such noncomposite molds may comprise either individual 'mold blocks' which can further be attached to a surface so as to make an array of molds, or an array of individual molds can be formed directly into the surface of a single block of such material.

In yet another embodiment where UV radiation initiation of polymerization is used, thin films may be molded to a substrate within seconds after UV irradiation. Moreover, such films having high uniformity with one another may be reproduced from the molds onto individual substrates.

In still other embodiments, the system of molding thin films to substrate surfaces may be carried out in a repetitive fashion so as to allow for the formation of a multiplicity of thin film layers onto the surface of a single substrate. In this embodiment, it is contemplated that each layer will provide a specific property to the permeation layer as desired.

DETAILED DESCRIPTION OF THE PREFERRED EMBODIMENTS

Figure 1:
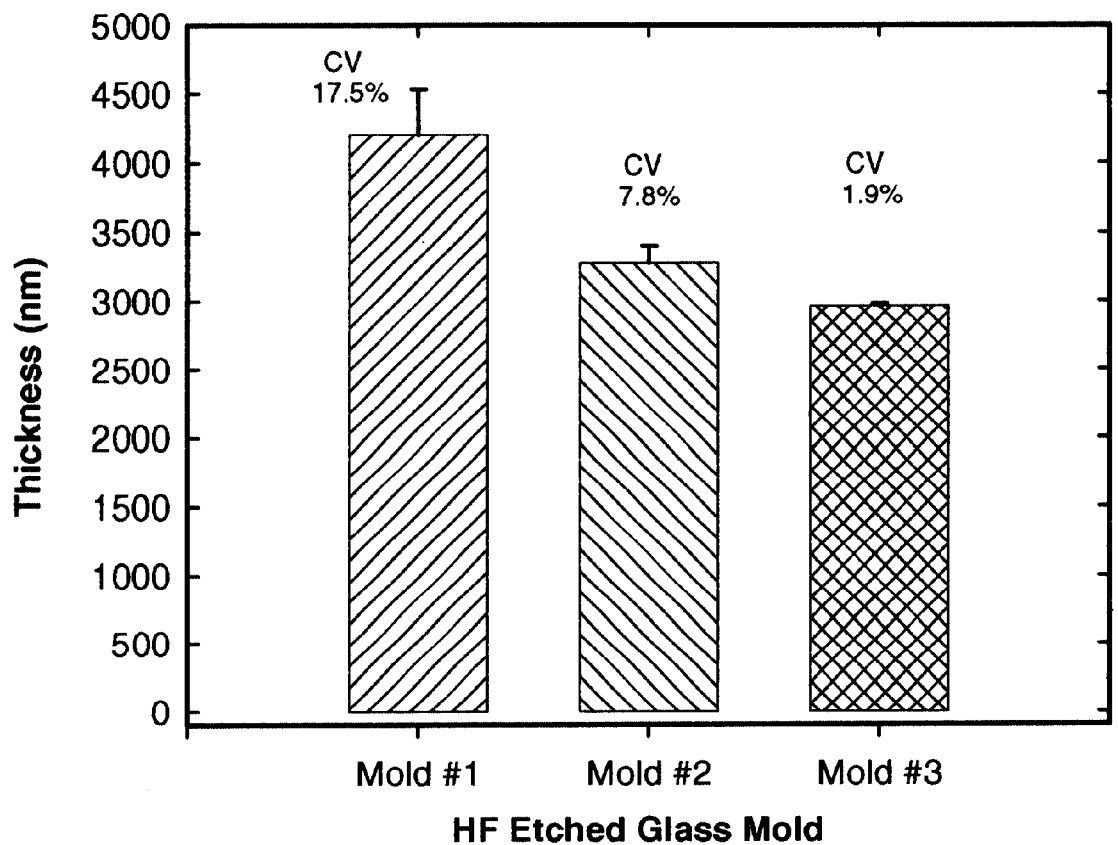
FIG. 1 is a bar graph showing coefficients of variability (CV) between thicknesses of thin films produced on different microchips of three different glass molds in which the mold cavity was etched using a hydrofluoric acid (HF) etching treatment process.

Referring now to specific embodiments of the invention, a microreaction mold system is provided having a mold cavity bottom that is transparent for at least one wavelength of electromagnetic radiation thereby forming a 'window' to allow transmission of an activation energy such as UV, Vis, and IR radiation. The element of such 'transparency' in the mold bottom provides the opportunity wherein materials within the mold cavity can be induced to react on demand by the activation of chemical moieties that are sensitive to the wavelength of the electromagnetic radiation used. In a preferred embodiment, such reactive moieties act to initiate polymerization of certain polymerizable monomers.

In a particularly preferred embodiment, chemical moieties comprising polymerizable monomers may be premixed with polymerization initiator chemicals that are sensitive to UV irradiation and dispensed into the mold cavity. Upon contact with UV irradiation directed through the mold bottom, the monomers and initiators are induced to react in a polymerization reaction such that the solution becomes a polymer within seconds of contact with the UV light.

In another embodiment, mold window materials that are transparent to IR radiation may be used in conjunction with heat sensitive initiators. In such embodiment, the necessary IR energy may be applied to the mold cavity by maintaining the mold at a temperature of between 15 and 250° C. for a requisite period to induce polymerization.

In another embodiment, polymerizable materials may be used in conjunction with initiators that are chemically sensitive as opposed to UV or IR sensitivity.

In still another embodiment, polymerizable materials may be used in conjunction with initiators that are sensitive to visible light wavelengths.

Thus, in the preferred embodiments, polymerization initiators may comprise those that are sensitive to any of visible light, UV irradiation, thermal radiation (IR), or that react on contact with specific chemical moieties.

Representative classes and examples of UV photoinitiators which may be used include benzyl ketal photoinitiators such as 2,2-dimethoxy-2-phenylacetophenone, benzoin ethers such as 2-methoxy-2-phenylacetophenone, hydroxy alkyl phenyl ketones such as 2-hydroxy 2-methyl-1-phenyl-propan-1-one, dialkoxy acetophenones such as 2,2-diethoxy acetophenone, benzoyl cyclohexanol ketones such as 1-hydroxycyclohexyl phenyl ketone, benzoyl phosphine oxides such as 2,4,6-trimethylbenzoyl diphenylphosphine oxide, alkylthiophenyl morpholino ketones such as 1-methyl-1-(4-methylthiophenyl)-2-morpholino propan-1-one, morpholinophenyl amino ketones such as 2-benzyl-2-N,N-dimethylamino-1-(4-morpholinophenyl)-1-butanone. Additional UV photoinitiator classes of compounds which work in the presence of hydrogen or electron donors (coinitiators) include phenones such as benzophenone, thioxanthones such as chlorothioxanthone, quinones such as camphorquinone, and ketocoumarins such as 1-phenylketocoumarin and the benzil class.

Representative chemical and thermal initiators include azonitriles such as 2,2'-azobisisobutyronitrile, azo derivatives such as 2,2'-azobisisobutyramidine, alkylperoxides such as tert-butyl peroxide, acyl peroxides such as benzoyl peroxide, hydroperoxides such as tert-butyl hydroperoxide and ketone peroxides such as acetone cyclic diperoxide, persulfate initiators such as ammonium and potassium persulfate, and azide initiators such as p-toluenesulfonyl azide. Some of these, such as APS, work in the presence of coinitiators such as TEMED.

In a most preferred embodiment, initiators may be selected from the group consisting of azobisisobutyronitrile (AIBN), ammonium persulfate and tetramethylethylenenediamine (APS/TEMED), benzol peroxide, and a solution of 50% 2,4,6-trimethylbenzoyl diphenylphosphine oxide and 50% 2-hydroxy 2-methyl-1-phenyl-propan-1-one (D4265).

The current invention contemplates generally that monomers can be formed into polymeric thin films using, UV, Vis, or IR irradiation, or, chemically sensitive initiators. Such monomers are contemplated to include those selected from the group consisting of epoxides, alkenyl moieties including, but not limited to, substituted or unsubstituted α, β unsaturated carbonyls wherein the double bond is directly attached to a carbon which is double bonded to an oxygen and single bonded to another oxygen, nitrogen, sulfur, halogen, or carbon; vinyl, wherein the double bond is singly bonded to an oxygen, nitrogen, halogen, phosphorus or sulfur; allyl, wherein the double bond is singly bonded to a carbon which is bonded to an oxygen, nitrogen, halogen, phosphorus or sulfur; homoallyl, wherein the double bond is singly bonded to a carbon which is singly bonded to another carbon which is then singly bonded to an oxygen, nitrogen, halogen, phosphorus or sulfur; and alkynyl moieties wherein a triple bond exists between two carbon atoms.

Since it is desired for the material being formed into a film in the mold to anneal to the surface of a substrate, e.g. an electronically addressable microchip, in a preferred embodiment, the substrate, may be precoated with a covalent coupling agent such as those commercially available and known to those skilled in the art. For example, methacryloxypropyl trimethoxysilane may be applied to the substrate surface allowing chemical moieties of the permeation layer polymer matrix to bond to the substrate.

In a preferred embodiment, the substrate serves as a mold 'top'. Prior to exposing the polymerizable monomer/initiator contents of the mold to polymerization initiating radiation, the substrate is placed securely against the upper surface of the material framing the mold cavity. Whether this upper surface comprises a metal or polymer frame, or surface of a noncomposite material (i.e., for example, quartz, silicate, or polycarbonate), the substrate surface is made to come into contact with the polymerizable monomer solution such that as the substrate is lowered into place and made to abut the mold cavity frame, excess solution is expelled from the mold cavity. In embodiments where chemical initiators are used, such initiators are added to the monomer mixture just before the monomer/initiator solution is added to the mold cavity.

In embodiments that include fill chambers, the substrate may be placed on top of the mold cavity prior to addition of the polymerizable solution. Then, the solution may be directed from one fill port into the mold void, and excess fluid may be passed into the second port.

In a preferred embodiment, a mold cavity can be formed in the upper surface of a transparent material either mechanically, such as by sonication, or by etching to a depth of between 100 nanometers and 100 $\mu$m. In one embodiment where a composite metal frame/transparent window mold is used, the depth of the well cavity may be adjusted by adjusting the position of the transparent material in relation to the frame such that the upper surface of the transparent material is below the upper surface of the frame by a depth of between 100 nanometers and 100 $\mu$m.

Where use of a metal is contemplated for the frame, such metal can comprise 304 stainless steel, 316 stainless steel or titanium. For embodiments using a polymer frame, examples of suitable polymers include polytetrafluoroethylene, polyfluoroalkoxane (PFA), and polyetheretherketone (PEEK).

The materials contemplated for the window, whether for composite or noncomposite embodiments, includes inorganic glass such as fused silica and derivatives thereof, crystalline such as quartz, sapphire, geranium, and silicon, and organic polymers such as polyacrylates or polycarbonates. In each case, the material is chosen for its ability to allow transmission of at least any one of visible light wavelengths, UV radiation, and IR radiation.

In yet another embodiment, the substrate having the attached polymerized thin film is easily removed from the mold without damaging bonding of the thin film to the substrate or damaging the newly formed thin film itself. Separation of the substrate from the mold may be easily assisted by precoating the mold surface (i.e., surface of the window material making up the bottom of the mold cavity) with a nonstick chemical (i.e. a mold-form release agent). Such materials include, but are not limited to, perfluorosilanes such as heptadecafluorotetrahydrodecyltrichlorosilane, chlorosilanes such as chlorotrimethylsilane, and alkoxysilanes such as methoxytrimethylsilane. Other nonstick coatings contemplated for use also include those selected from the group consisting of fluoropolymers, and materials deposited by reactive gas such as plasma polymerizable monomers. Surfaces having such coatings allow not only for easy release of the molded film from the mold cavity but also for the transmission of UV light energy to the solution to be polymerized into the film.

The sizes of the mold cavities can be any size useful for molding thin films onto very small substrate surface areas. In a preferred embodiment, the wells can comprise an area as small as 10 $\mu$m$^2$ or as large as 100 cm$^2$ or more. Mold cavities can be easily formed in the surface of a window material as defined herein either mechanically, such as by sonication, or by etching using well known hydrofluoric acid etching techniques or buffered oxide etches.

The mold system may further be operated in such a manner as to easily apply multiples of thin film layers onto substrate surfaces. For example, a base layer having various properties may be applied to the substrate. Useful properties for a base layer include (1) resistance to acidic and basic conditions caused by pH extremes resulting from, for example, biasing the electrodes of an electronically addressable microchip substrate, and (2) insulation like property for protecting the molecules to be transported from the electrochemistry of the electrode itself. Secondary films may comprise reagent moieties for attaching, either covalently or noncovalently, capture molecules. Other layers may include reagents for ion or oxygen transport, scavengers of free radicals, or enhanced wetting properties.

In operation, as an example, the molding process may comprise the following steps:

Step 1. First, the substrate surface is treated with a covalent coupling agent to obtain preferential surface adhesion, the mold surface having been previously treated with a nonstick release agent.

Step 2. The polymerizable monomer/initiator solution is deposited onto the surface of the mold. (The mold may be oriented in either a right-side up or and upside down position. Where the mold is below facing up, the solution may be deposited into the mold well. Where the mold is above facing down, the solution may be deposited onto the substrate surface.)

Step 3. The substrate or 'top' of the mold (e.g. a microchip) is brought into contact with the mold such that the substrate abuts the frame surrounding the mold cavity.

Step 4. The monomer/initiator solution is induced to polymerize or 'cure' by contacting the solution with an initiator activation source. In a preferred embodiment, this source is UV irradiation that is channeled or uniformly distributed through the window for generally between 2 and 2000 seconds, usually between 2 and 300 seconds, and preferably between 2 and 30 seconds.

Where UV irradiation is used, the light energy is contemplated to comprise an energy range of between 0.1 milliWatt/$cm^2$ and 1000 milliWatt/$cm^2$. Preferably, the UV intensity is 100 mW/ $cm^2$ using 320–390 nm wavelengths. Where thermally sensitive initiators are used, the mold can be heated to a temperature of between 15 and 250° C. for between 5 and 2000 seconds. The heat can be from either an infrared emitting light source or a non-light source. Where chemical initiators are used, the reaction solution can be maintained in the mold for between 1 minute and 30 minutes for completion of the polymerization of the thin film onto the substrate.

Step 5. Following polymerization in step 4, the substrate with its adherent thin film is separated from the mold cavity.

Step 6. The thin film coated substrates are washed to remove extraneous reactants then dried.

Step 7. The mold is immediately available for use in another molding reaction wherein steps 1–6 may be repeated. In a preferred embodiment, the mold system can be used to apply multiple layers of thin films to the substrate.

In applications where the monomer solution is channeled into the mold cavity using fill ports, the top or substrate may be contacted with the mold prior to filling the mold with the polymerizable solution.

Results

EXAMPLE 1

Glass Slide Method

Figure 2:
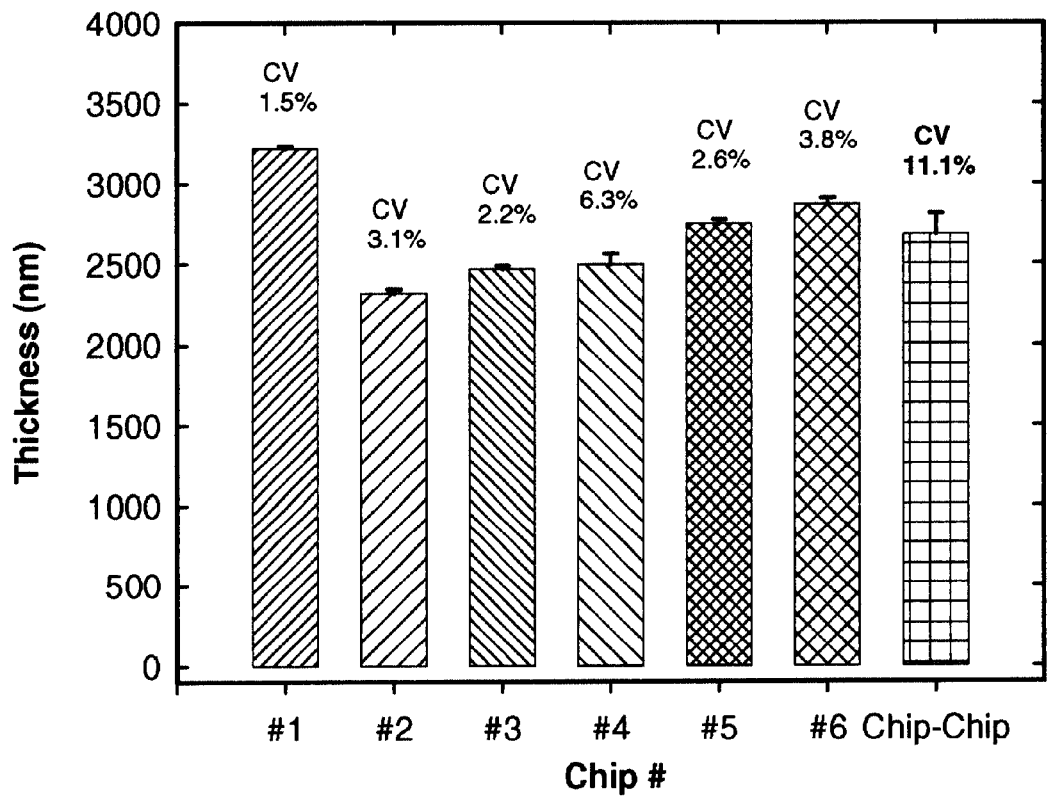
FIG. 2 is a bar graph showing CVs between capture sites of pads of individual microchips using the same mold for forming thin films on each of six different microchips.

In a glass slide mold system, thin films were obtained having highly uniform thicknesses between different microchip substrates such that the 'coefficients of variation' (CV) among the microchips was less than 11.1%. Moreover, the thickness of the films overlying the individual electrodes or capture sites (i.e., pads) of the microchip had pad to pad coefficients of variation of less than 6.3%. These results are shown in FIGS. 1 and 2. In FIG. 1, three different etched glass molds were used to apply an acrylamide solution (19:1 acrylamide:bisacrylamide) to the microchip surface. Six tests were performed using mold number 1, five tests were performed using mold number 2 and seven tests were performed using mold number 3. As can be seen, the coefficients of variation were 17.5%, 7.8%, and 1.9% respectively. The molds were each formed using HF etching technology. (For example, the etching of borosilicate glass windows can be carried out with 48% HF for up to two minutes followed by washing with water to obtain an etched mold well of about 10 $\mu$m in depth.)

In FIG. 2, mold 3 was further used in testing pad to pad film thickness variability. For each microchip, seven different pads on the same chip were tested. As indicated, the pads of microchip 1 had a CV of 1.5%. Likewise the pads of microchips 2–6 had CVs of 3.1%, 2.2%, 6.3%, 2.6%, and 3.8% respectively. The variation between the six different chips using the same mold (mold number 3) was 11.1%.

EXAMPLE 2

Quartz/metal Composite Method

Figure 3:
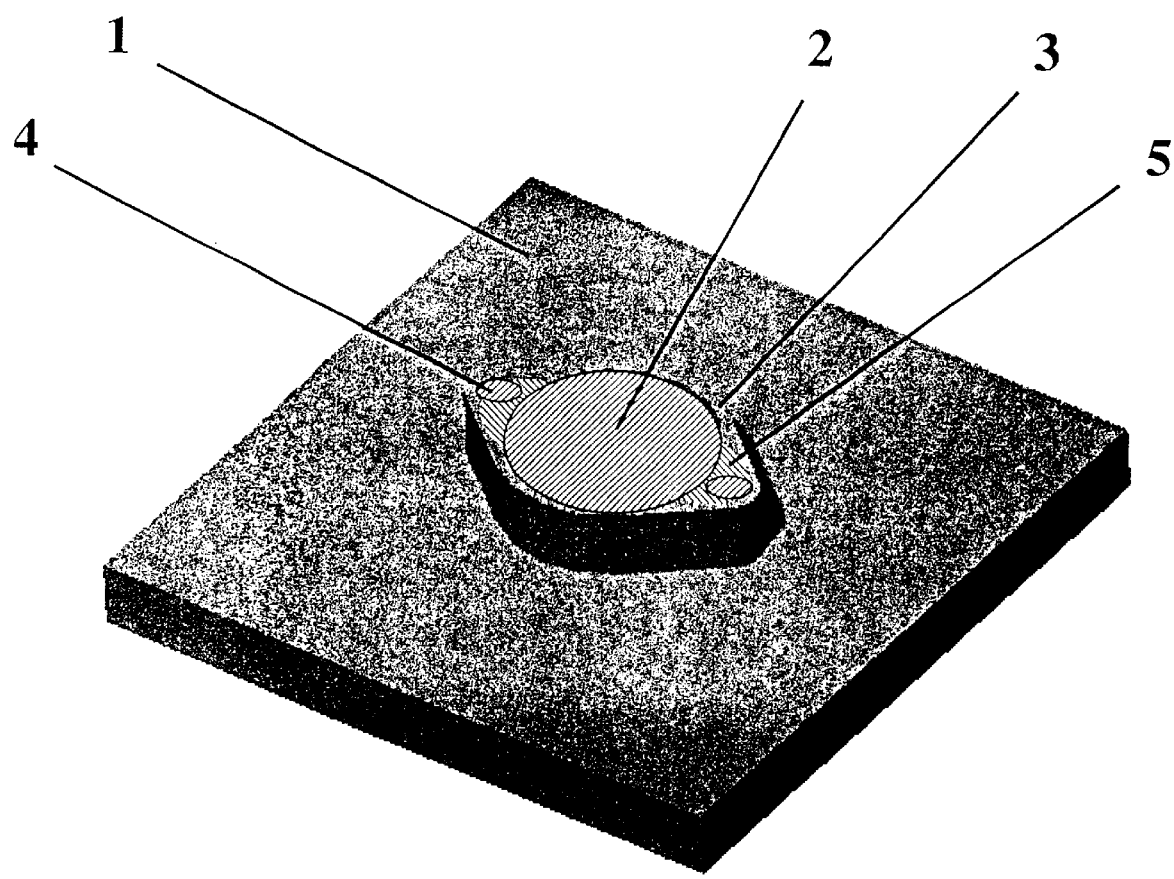
FIG. 3 is perspective drawing of a composite quartz and metal microreaction mold having an adjustable quartz window such that the position of the window may be adjusted to form a mold cavity of variable depths. The figure further shows fill ports on either side of the mold chamber.
Figure 4:
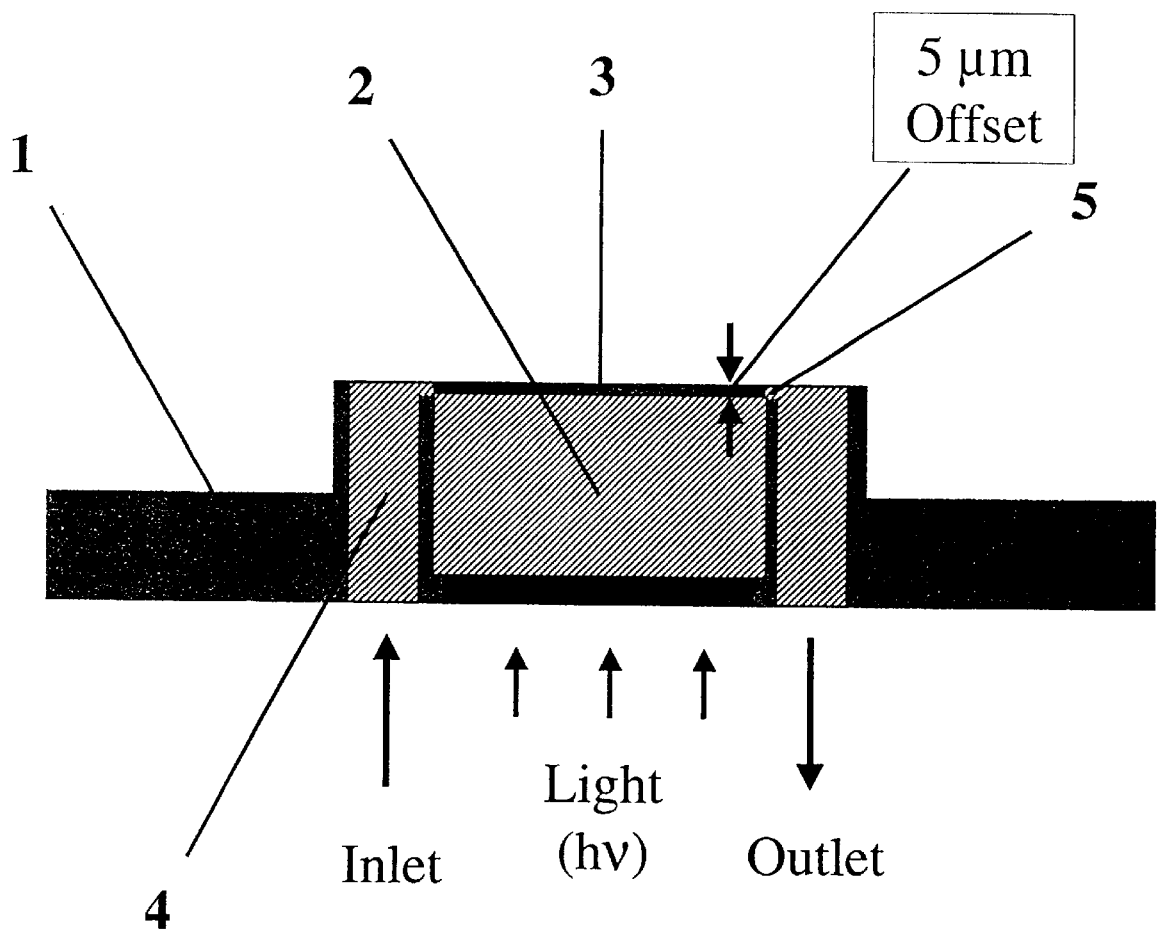
FIG. 4 is a side view of the composite mold showing various features of the composite mold system.

In this example, a composite quartz/metal mold having an adjustable quartz window was manufactured as shown in FIGS. 3 and 4. In FIG. 3, base plate (1) may be integrally associated with well frame (3). Inside well frame (3) is transparent window (2) set to be offset from the upper edge of the frame so as to create a mold cavity. Set laterally at opposing positions are mold fill wells (4). FIG. 4, shows a cross section of the mold system of FIG. 3. As indicated, in the example of the drawing, the transparent window is offset by 5 $\mu$m. Also shown is the fill channels (5) for importing to and exiting fluid from the mold cavity.

Figure 6:
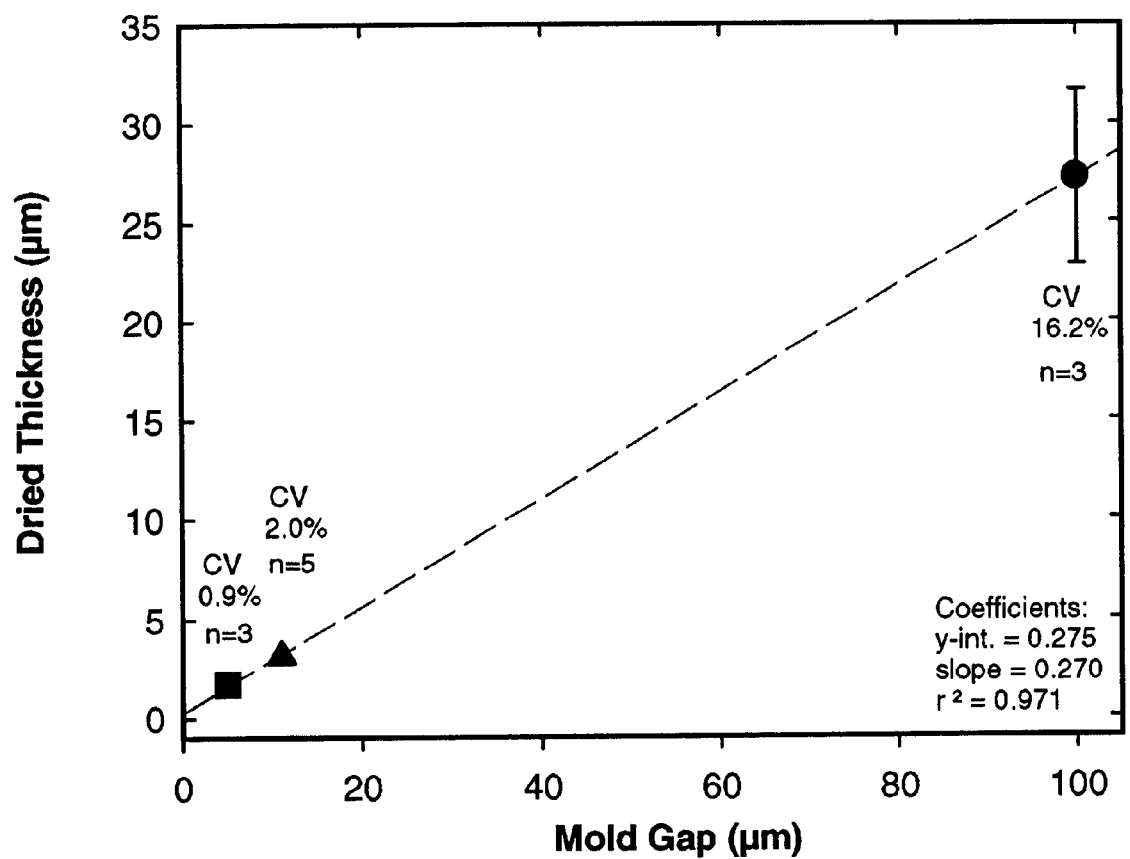
FIG. 6 is a graph showing the consistency in film thickness variability whether the film is 5 or 100 $\mu$m thick.
Figure 7:
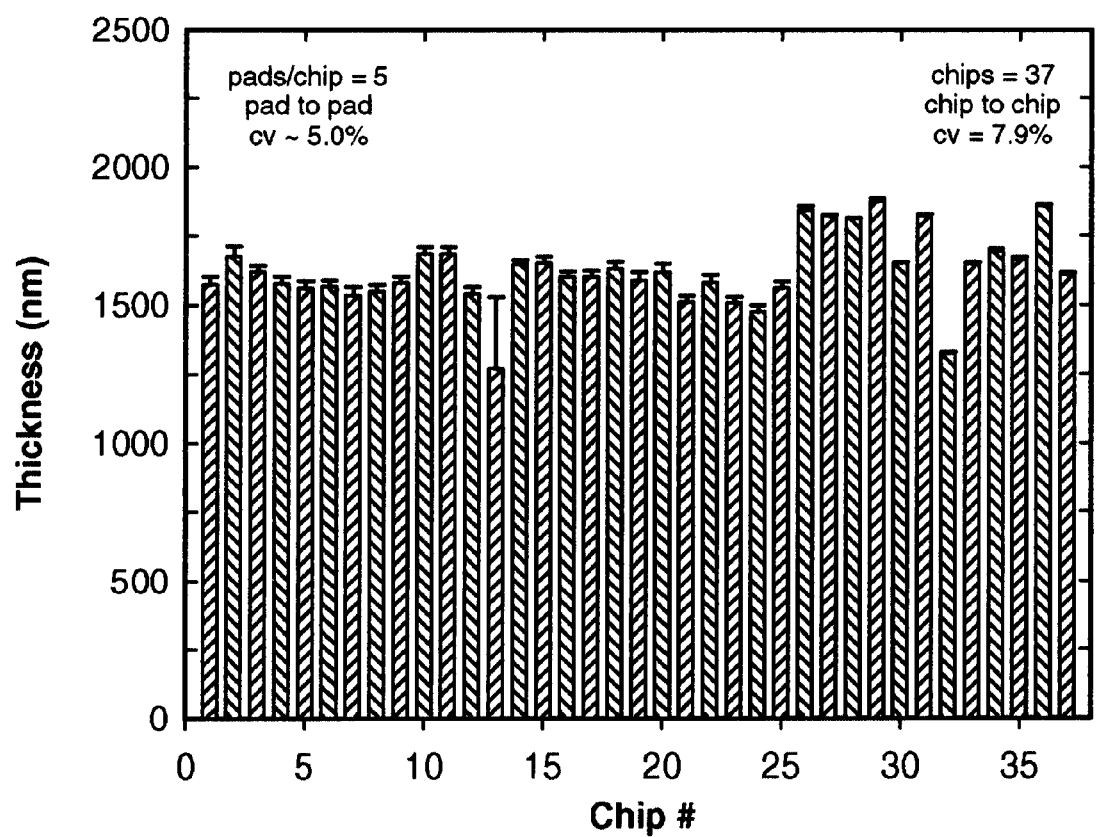
FIG. 7 is a bar graph showing the consistency of variability between thin films produced on chips using a composite quartz/metal mold.

The mold cavity thickness (and consequently the thin film thickness) can be reproducibly adjusted to within a few percent by adjusting the window position. For example, FIG. 6 shows results of consistency variability in terms of thickness CVs for thin films produced with the window set at three different positions. The thicknesses tested were 5, 11, and 100 $\mu$m. The CVs were 0.9, 2.0 and 16.2% respectively. As shown in FIG. 7, the chip to chip CV was 7.9% and the pad to pad CV was less than 5.8% for a set of 37 microchips.

EXAMPLE 3

Multilayer Molding

Figure 5A:
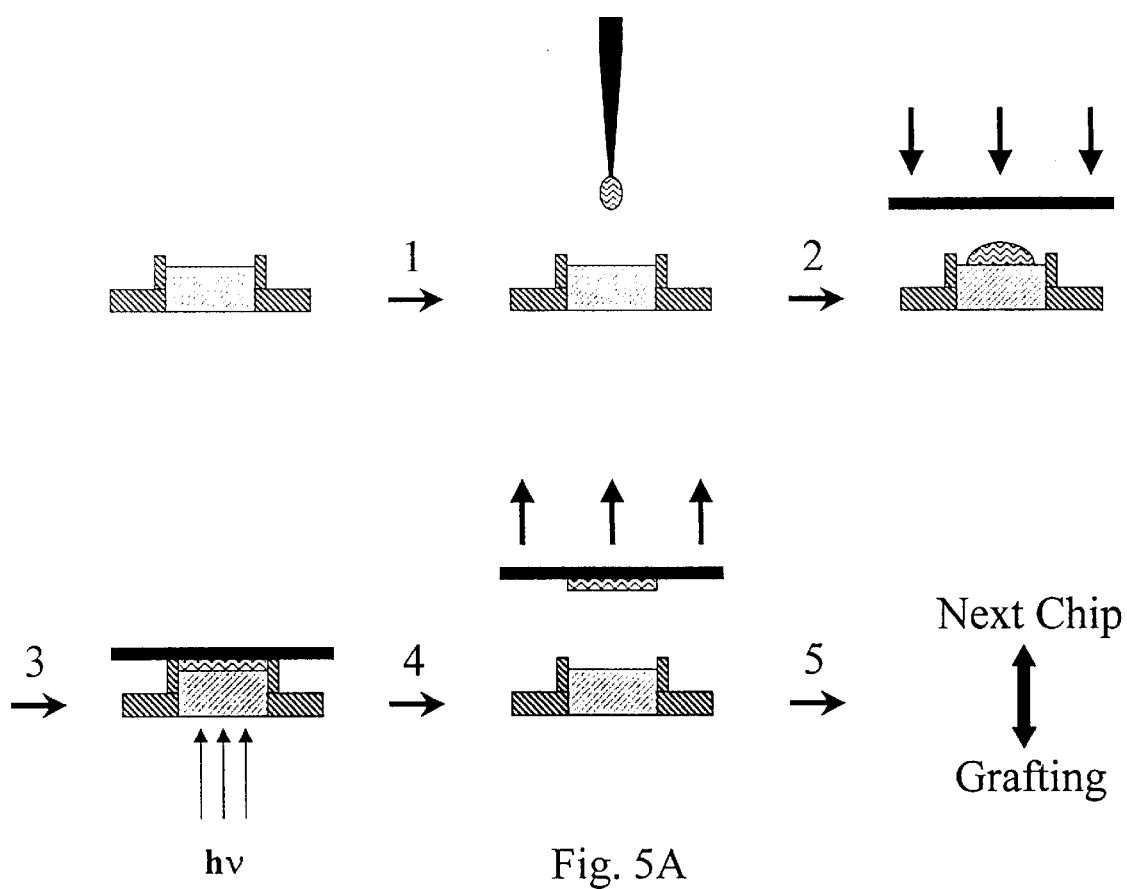
FIGS. 5A–F show sequences of the molding process wherein either single thin film layers are applied to the substrate (5A) or multiple films are applied either uniformly stacked (5B) or layered in variable formats (5C–F).
Figure 5B:
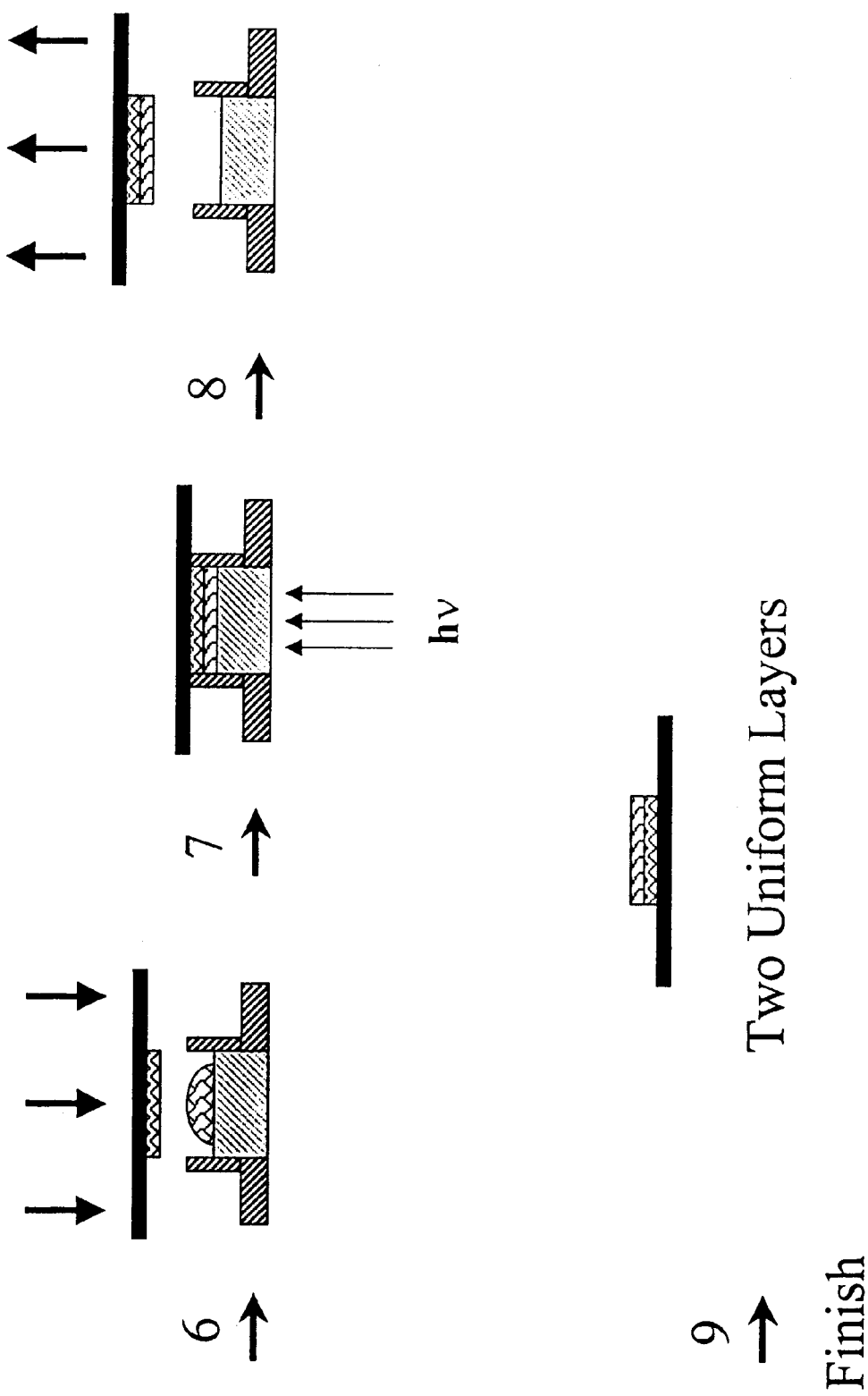
Figure 5C:
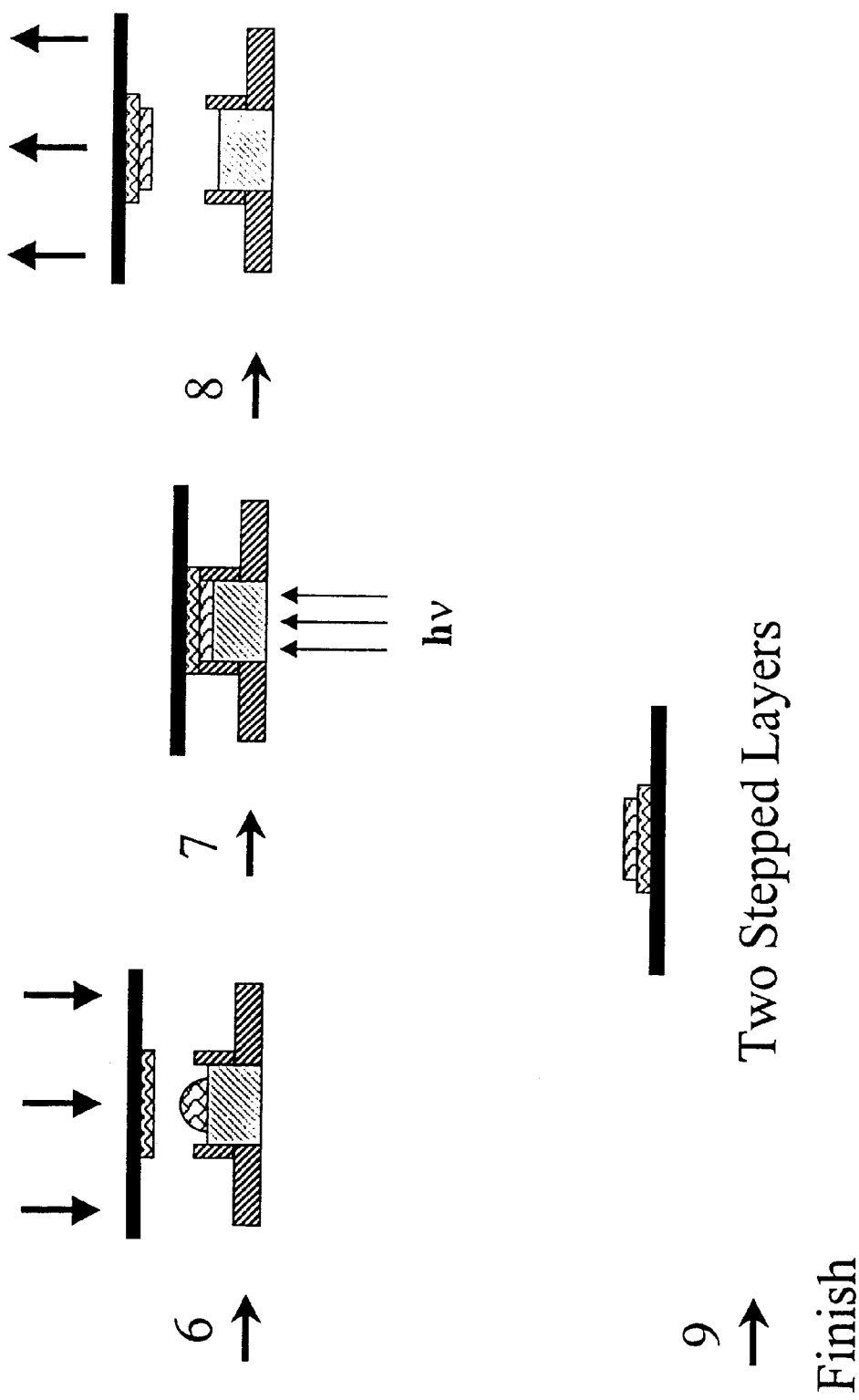

In this example, the system of the invention is used to apply multiple layers onto the substrate surface. As shown in FIGS. 5A–F, multiple layers may be applied in several formats. For example, the mold may be prepared for receiving polymerizable solution. Preparation may include applying a nonstick surface to the mold cavity (1). Following dispensing the solution into the well (2), the substrate surface may be contacted to the mold (3). The solution is polymerized by contacting the solution with radiant energy, and the first layer bound to the substrate may be removed from the mold. FIG. 5B shows that the substrate having a base thin film layer can be contact with the same or a different mold for application of a second layer.

Figure 5D:
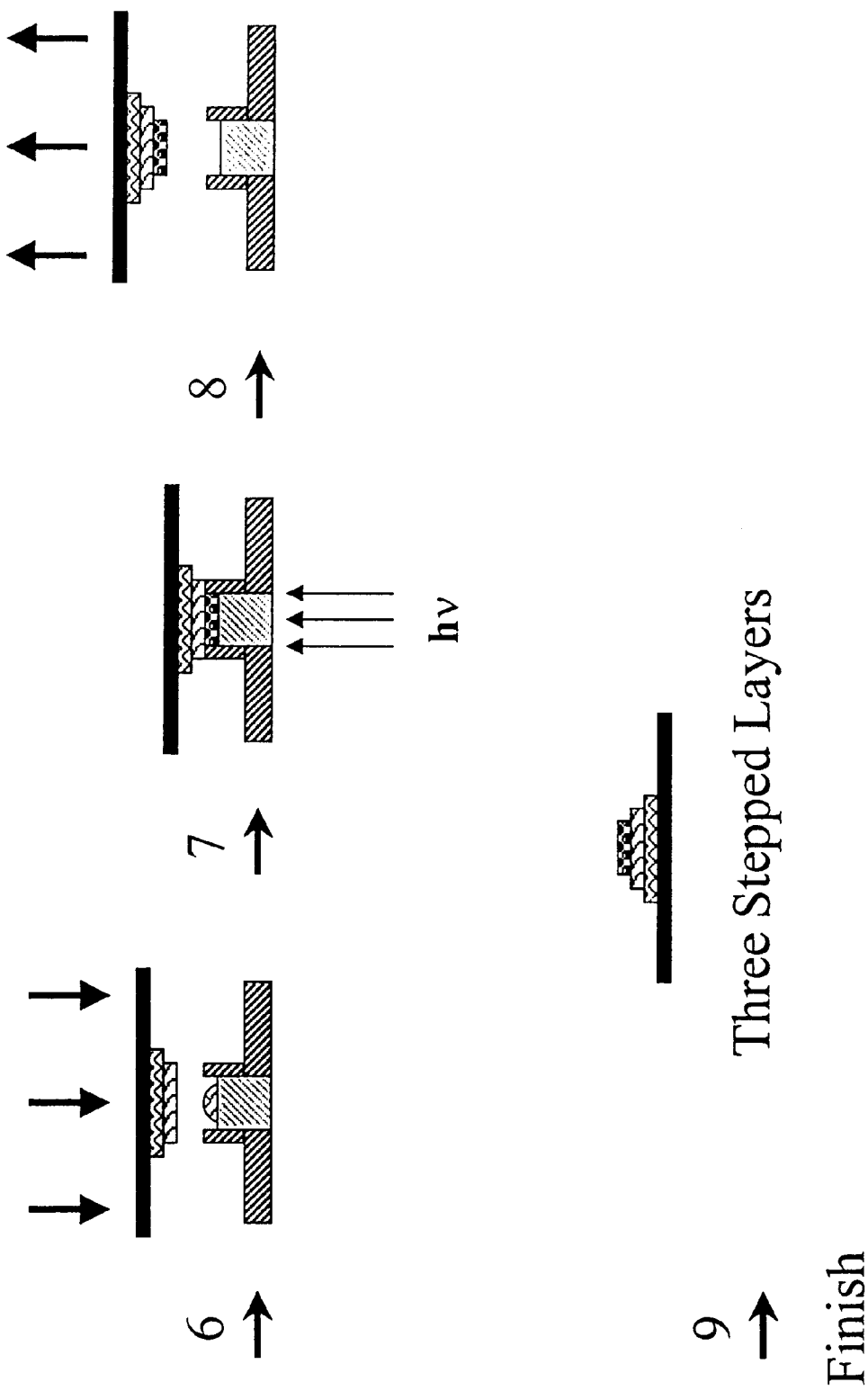
Figure 5E:
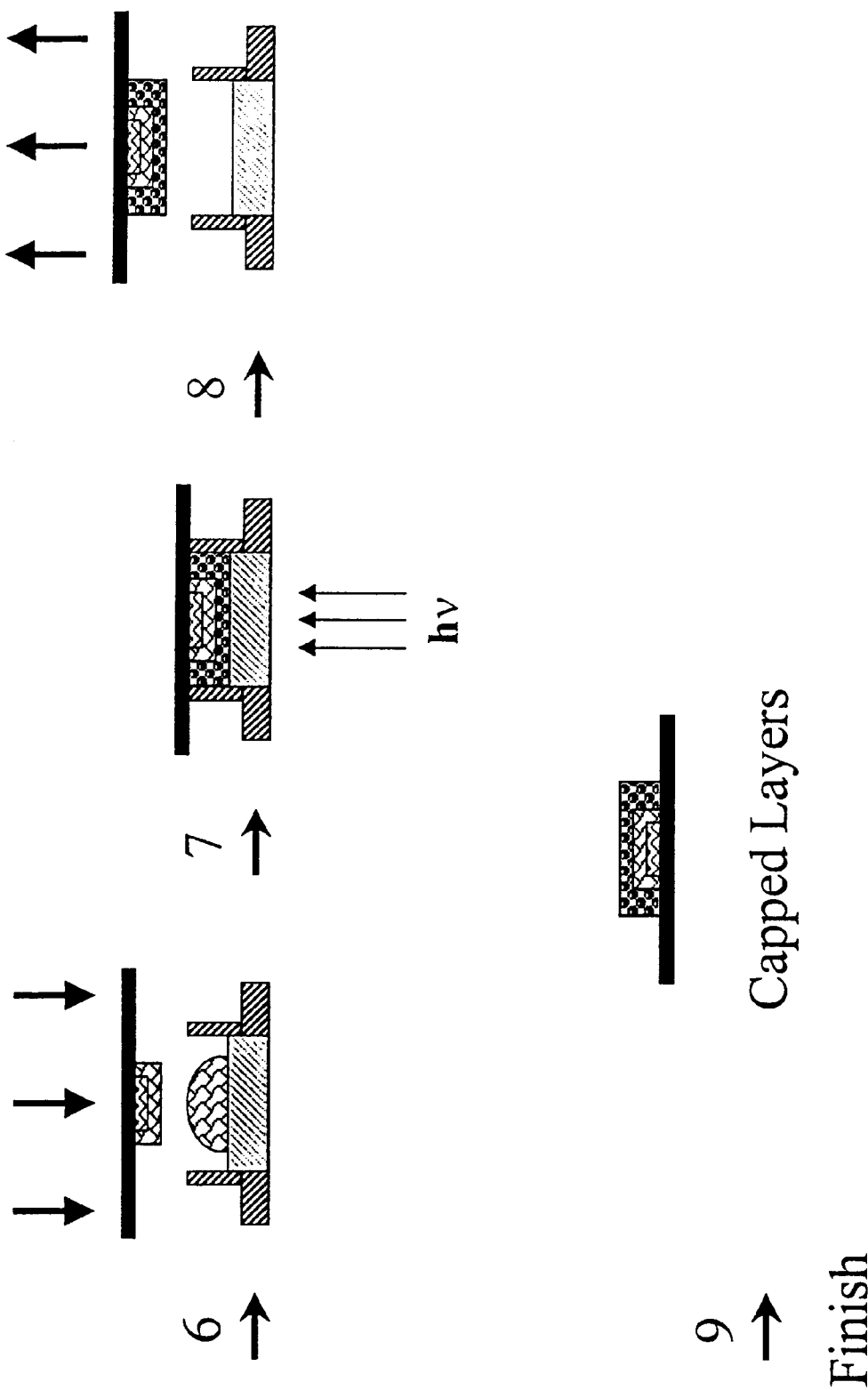
Figure 5F:
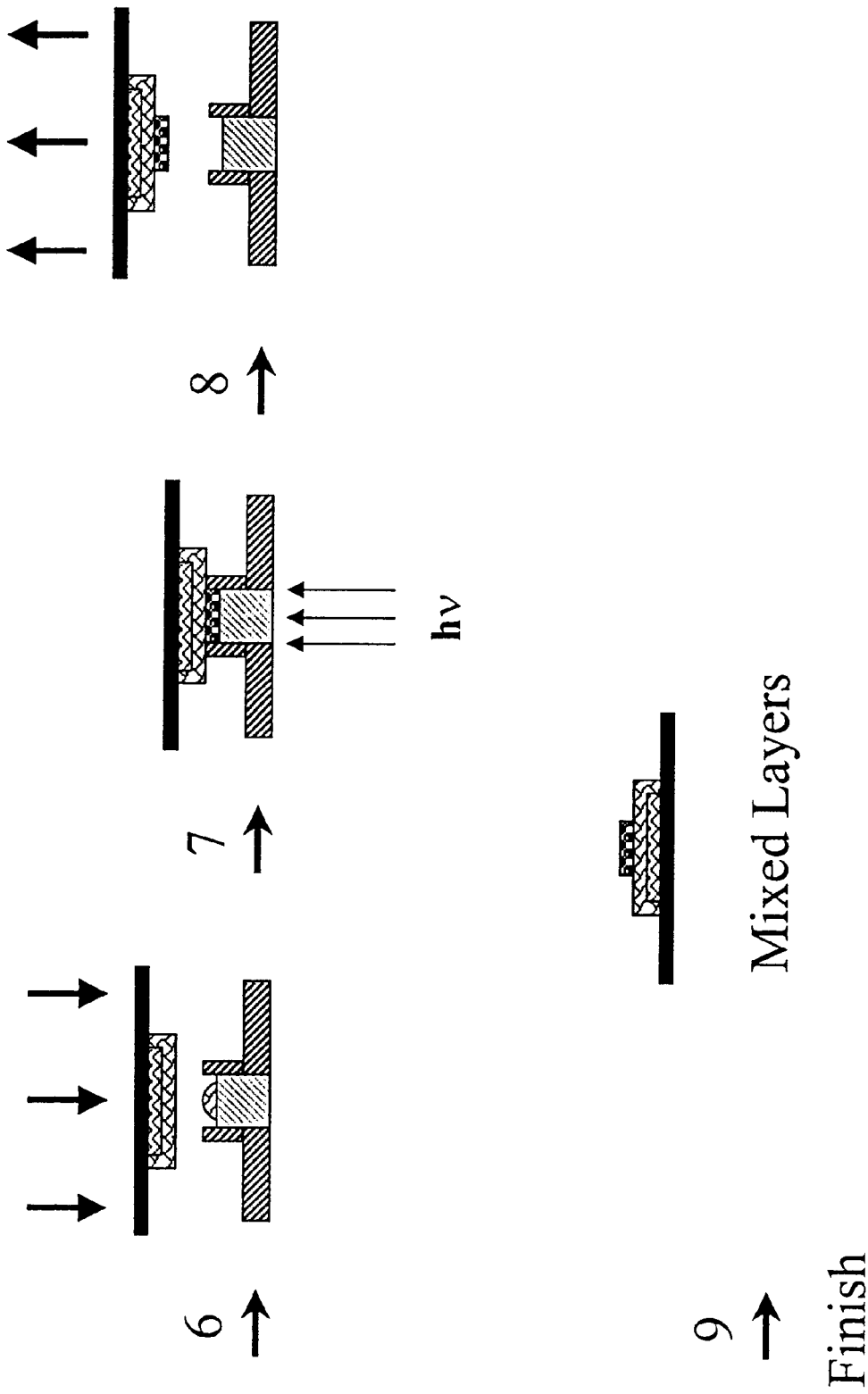

In another embodiment, the application of multiple layers can include applying the layers in a staggered fashion such that one layer may completely encompass an underlying layer or only partially cover an underlying layer. As shown in 5C, the secondary layer is smaller than the primary layer. In this example, the second layer has been applied by simply using a mold having smaller area dimensions. In FIG. 5D, a third layer is applied having yet a smaller area. In FIG. 5E, layers are applied using reaction molds having consecutively larger areas. In FIG. 5F, yet another embodiment is provided showing the versatility of the thin film application of the invention wherein consecutive layers may be applied in a variable format. Here, the secondary layer is applied using a larger mold cavity so that the first layer is completely covered by the second layer while the third layer is applied using a smaller mold. Applying the thin layers in such a fashion provides for a base layer that may be denser than the outer layers to protect against the pH extremes and the harsh ionizing environment at the electrode's metal surface. The middle layer may be less dense than the base layer and have moieties for attaching molecules transported to the electrode position. The middle layer may also have a property that facilitates easy washing out of captured molecules. The third layer may contain an attachment chemistry different from the second layer for binding particular molecules from the test solution so that one capture pad may be used to detect several different molecules of interest.

Modifications and other embodiments of the invention will be apparent to those skilled in the art to which this invention relates having the benefit of the foregoing teachings, descriptions, and associated drawings. The present invention is therefore not to be limited to the specific embodiments disclosed but is to include modifications and other embodiments which are within the scope of the appended claims. All references are herein incorporated by reference.

We claim:

1. A method of molding a thin film onto an electronically addressable microchip surface comprising:
   a. in a microreaction mold system comprising:
      i. a window element comprising a material transparent to at least one wavelength of electromagnetic radiation, the window element further having an upper surface which forms the bottom of at least one mold cavity, the cavity having a depth of between 100 nm and 100 $\mu$m;
      ii. at least one mold cavity side; and
      iii. a top comprising an electronically addressable microchip substrate to which a solidifiable chemical composition placed in the cavity, and in contact with the top, may become bound upon solidifying inside the cavity,
         dispensing onto the window element of the microreaction mold system a solidifiable hydrogel composition comprising polymerizable monomers and a polymerization initiator compound, wherein the polymerization initiator compound is sensitive to an activation energy to which the window element is transparent;
   b. bringing the substrate surface into tight juncture with the sides of the mold cavity to form the top of the microreaction mold system;
   c. exposing the microreaction mold to an activation energy source, whereby the mold cavity is exposed to the activation energy transmitted through the window element, at an energy level sufficient to initiate polymerization of the monomers, for between 2 and 2000 seconds; and
   d. separating the mold from the substrate to reveal the film molded to the surface of the substrate.

2. The method of claim 1 wherein the microreaction mold system further comprises a mold frame which forms the sides of the mold cavity, wherein the window element is inserted within the mold frame.

3. The method of claim 2 wherein the window element is slidably inserted within the frame, so that the depth of the mold cavity may be adjusted.

4. The method of claim 3 wherein the upper surface of the transparent material is adjustable relative to the frame such that the cavity defined by the frame and the upper surface has a depth of between 0.1 $\mu$m and 100 $\mu$m.

5. The method of claim 2 wherein the frame is made of a material selected from the group consisting of a metal and a polymer.

6. The method of claim 5 wherein the frame is made of a metal selected from the group consisting of stainless steel and titanium.

7. The method of claim 5 wherein the frame is made of a polymer selected from the group consisting of polytetrafluoroethylene, polyfluoroalkoxane (PFA), and polyetheretherketone (PEEK).

8. The method of claim 2 wherein the cavity has length dimensions of about between 1 mm and 3.5 cm and width dimensions of about between 1 mm and 3.5 cm.

9. The method of claim 1 wherein the mold cavity is formed within the window element, whereby the material of the window element forms the sides of the mold cavity.

10. The method of claim 1, wherein the microreaction mold system further comprises a means for securely holding the substrate.

11. The method of claim 1 wherein at least one cavity has area dimensions of between 10 $\mu m^2$ and 100 $cm^2$.

12. The method of claim 1 wherein the wavelength of electromagnetic radiation to which the window element is transparent is selected from the group consisting of ultra violet wavelengths, visible wavelengths, and infrared wavelengths.

13. The method of claim 1 wherein window element comprises a material selected from the group consisting of an inorganic glass, fused silica, silicon dioxide, transparent crystalline, quartz, sapphire, germanium, silicon, organic polymers, polyacrylates, and polycarbonates.

14. The method of claim 1 wherein the microreaction mold system further comprises a mold-form release agent coating at least one surface of the mold cavity.

15. The method of claim 14 wherein the release agent is selected from the group consisting of perfluorosilane, chlorosilane, alkoxysilane, and fluoropolymers.

16. The method of claim 1 wherein the mold cavity has a planar bottom.

17. The method of claim 1 wherein the mold cavity has a patterned bottom.

18. The method of claim 1 wherein the polymerizable monomers are selected from the group consisting of acrylamide, bisacrylamide, methacrylamide, N-alkyl acrylamides, functionalized ethylene glycol derivatives, N-vinyl pyrrolidinone, bis-cystamine, acrylates, methacrylates, acrylonitriles, and derivatives thereof.

19. The method of claim 1 wherein the polymerization initiator moieties are selected from the group consisting of AIBN, APS and TEMED, benzoyl peroxide, and D 4265.

20. The method of claim 1 wherein the activation energy is electromagnetic radiation in the visible spectrum.

21. The method of claim 1 wherein the activation energy is electromagnetic radiation in the ultraviolet spectrum.

22. The method of claim 21 wherein the mold cavity is exposed to an energy level in the range of between 0.1 mW/cm$^2$ and 1000 mW/cm$^2$.

23. The method of claim 21 wherein the ultraviolet radiation is of a wavelength between 320 to 390 nm.

24. The method of claim 1 wherein the activation energy is electromagnetic radiation in the infrared spectrum.

25. The method of claim 24 wherein the solidifiable hydrogel composition in the mold cavity is heated by the infrared electromagnetic radiation to a temperature of between 15° C. and 250° C.

26. The method of claim 24 wherein the microreaction mold is exposed to the infrared electromagnetic radiation for between 5 and 2000 seconds.

27. The method of claim 1 wherein the solidifiable hydrogel composition is dispensed onto the window element using ports in the mold cavity.

28. The method of claim 1 wherein the microreaction mold is exposed to the activation energy for between 2 and 300 seconds.

29. The method of claim 1 wherein the microreaction mold is exposed to the activation energy for between 2 and 30 seconds.

30. The method of claim 1 further comprising the steps of:
   e. washing the mold;
   f. repeating steps (a) through (d) at least one time to form at least one additional thin film layer on top of the thin film layer formed in (d);
whereby a plurality of thin film layers are formed on the substrate surface.

31. The method of claim 30 wherein each of the thin film layers comprise a distinct composition of a polymer and/or reagents.

32. The method of claim 1 further comprising the step of:
   e. repeating steps (a) through (d) using a microreaction mold of the same or different size at least one time to form at least one additional thin film layer on top of the thin film layer formed in (d),
whereby a plurality of thin film layers are formed on the substrate surface.

33. The method of claim 32 wherein each of the thin film layers comprise a distinct composition of a polymer and/or reagents.

* * * * *

UNITED STATES PATENT AND TRADEMARK OFFICE
CERTIFICATE OF CORRECTION

PATENT NO.    : 6,524,517 B1
DATED         : February 25, 2003
INVENTOR(S)   : Havens et al.

It is certified that error appears in the above-identified patent and that said Letters Patent is hereby corrected as shown below:

<u>Title page,</u>
Item [75], Inventors, please change "Havens R. John" to -- John R. Havens --.

Signed and Sealed this

Seventeenth Day of June, 2003

JAMES E. ROGAN
*Director of the United States Patent and Trademark Office*